(12) United States Patent
Menkhoff

(10) Patent No.: US 7,492,831 B2
(45) Date of Patent: Feb. 17, 2009

(54) METHOD FOR GENERATING MULTIPLIER COEFFICIENTS FOR A MIXER

(75) Inventor: Andreas Menkhoff, Oberhaching (DE)

(73) Assignee: Infineon Technologies AG, Munich (DE)

( * ) Notice: Subject to any disclaimer, the term of this patent is extended or adjusted under 35 U.S.C. 154(b) by 799 days.

(21) Appl. No.: 10/723,696

(22) Filed: Nov. 26, 2003

(65) Prior Publication Data

US 2004/0162050 A1     Aug. 19, 2004

(30) Foreign Application Priority Data

Nov. 27, 2002    (DE)    ................................. 102 55 351

(51) Int. Cl.
*H04L 27/10*    (2006.01)
(52) U.S. Cl. ...................................... 375/278; 375/284
(58) Field of Classification Search ................. 375/296, 375/291, 148, 147, 232, 233, 231, 350, 146, 375/254, 226, 227, 346, 284, 285; 714/781, 714/758, 767, 782; 702/75; 331/25
See application file for complete search history.

(56) References Cited

U.S. PATENT DOCUMENTS

| | | | | | |
|---|---|---|---|---|---|
| 4,021,653 | A | * | 5/1977 | Sharp et al. | ................... 708/312 |
| 4,084,472 | A | * | 4/1978 | Niimi | ............................ 84/607 |
| 4,317,206 | A | * | 2/1982 | Nossen | ........................ 375/224 |
| 5,539,357 | A | * | 7/1996 | Rumreich | ..................... 331/17 |
| 5,825,254 | A |   | 10/1998 | Lee | |
| 6,219,815 | B1 | * | 4/2001 | DesJardins et al. | ........... 714/781 |
| 6,456,950 | B1 | * | 9/2002 | El-Ghoroury et al. | .......... 702/75 |
| 6,856,925 | B2 | * | 2/2005 | Muhammad et al. | ........... 702/75 |
| RE39,385 | E | * | 11/2006 | Brightman et al. | ........... 708/490 |
| 2003/0061251 | A1 | * | 3/2003 | White | ......................... 708/300 |
| 2006/0153576 | A1 | * | 7/2006 | Bessios | ....................... 398/158 |

FOREIGN PATENT DOCUMENTS

DE    40 09 729 A1    10/1991

OTHER PUBLICATIONS

X. Liu et al "Recursive Calculation of the Two-Dimensional Maximum Likelihood Position Estimate for a Scintillation Camera", IEEE, Transaction on Nuclear Science, vol. 37, No. 2, Apr. 1990.*

* cited by examiner

*Primary Examiner*—Chieh M Fan
*Assistant Examiner*—Qutbuddin Ghulamali
(74) *Attorney, Agent, or Firm*—Maginot, Moore & Beck

(57) ABSTRACT

A mixer for mixing a digital input signal with a sampled sinusoidal signal, comprising a calculating circuit for calculating multipliers (MC) of a multiplier group (MG) which exhibits a number of dividing circuits for dividing the digital input signal applied to an input of the mixer, and a number of switchable adders/subtractors, the dividing factors of the dividing circuits being Homer coefficients of the resolved multipliers (MC) of the multiplier group (MG), the adders/subtractors being controlled in dependence on a first control bit (SUB/ADD) read out of a memory; a demultiplexer for switching through a zero value or the multiplier (MC) calculated by the calculating circuit in dependence on a second control bit (zero) read out of the memory; and comprising a sign circuit for outputting the positive or negative value switched through by the demultiplexer to an output of the mixer in dependence on a third control bit (SIGN) read out of the memory.

16 Claims, 7 Drawing Sheets

FIG 7

$\frac{1}{10}$ mixer

| SUB/ADD | ZERO | SIGN | O |
|---|---|---|---|
| X | 0 | 0 | 0 |
| 1 | 0 | 0 | 55 |
| 0 | 0 | 0 | 89 |
| 0 | 0 | 0 | 89 |
| 1 | 0 | 0 | 55 |
| X | 1 | 0 | 0 |
| 1 | 0 | 1 | -55 |
| 0 | 0 | 1 | -89 |
| 0 | 0 | 1 | -89 |
| 1 | 0 | 1 | -55 |

METHOD FOR GENERATING MULTIPLIER COEFFICIENTS FOR A MIXER

The invention relates to a method for generating multiplier coefficients for a mixer and to a mixer for mixing a digital input signal with a sampled sinusoidal signal.

A modulator has inputs for a carrier quantity and for a modulating quantity and an output for the signal produced by the modulation. If modulators are used for frequency conversion, they are also called mixers or frequency converters.

FIG. 1 shows an arrangement according to the prior art. A transmit signal generated by a transmitter is transmitted to a receiver via a transmission channel. The receiver converts the analog input signal into a digital signal having a particular frequency $f_s$. The mixer performs a frequency conversion by multiplication in the time domain, in which the sampled signal having the frequency $f_s$ is downconverted to an intermediate frequency IF for further data processing. The frequency conversion takes place at a particular ratio m. In the case of GSM, for example, m=10 whereas m=8 in the case of wireless LAN.

FIG. 2 shows the circuit configuration of a conventional 1:m mixer according to the prior art. The sampled signal is applied to an input I of the mixer. The received digital signal is conducted via data lines $n_1$ to a multiplier unit which multiplies the received digital signal by multiplication factors $MF_i$ with a particular word length WL in the time domain. The multiplied signal is supplied to a normalizing unit and output via an output O of the 1:m mixer.

The mixer shown in FIG. 2 contains a storage device for storing samples $aw_i$. In the memory, for example a ROM, m samples are stored. The samples are cyclically read out by an address generator and applied to the multiplier unit. The samples $aw_i$ are sampled values of a sinusoidal signal as shown in FIG. 3. The example shown in FIG. 3 shows the samples which are stored in a 1:10 mixer according to the prior art. In the memory of the mixer, 10 samples of the sinusoidal signal $aw_0$ to $aw_9$ are stored. In the example shown, the stored set of multipliers is: $MF_i=(0, +MF_1, +MF_2, +MF_2, +MF_1, 0, -MF_1, -MF_2, -MF_2, -MF_1, 0)$.

The mixer according to the prior art, as shown in FIG. 2, is used for shifting the frequency spectrum into the baseband of the incoming oversampled received signal. Mixing is done by the input signal being multiplied by the sampled sinusoidal signal as shown in FIG. 3. The mixing is preferably done after the analog/digital converter as shown in FIG. 1 since the signal processing is simpler in the baseband than in the passband.

In the example shown in FIG. 3 of a 1:10 mixer, $MF_1$=sine $\Pi/5$ and/or sine 36° and $MF_2$=sine 2 $\Pi/5$=sine 72°.

Therefore, $MF_1$=sine 36°=0.587785252 . . . and $MF_2$=sine 72°=0.951056516 . . .

If the amplitude of the received signal with a sampled sinusoidal signal is quantized, doubling the word length WL of the signal or sinusoidal signal, respectively, produces an accuracy which is greater by 6 decibels, the increase in accuracy of the ADC/DAC and of the mixer coefficients is mutually proportional. In a conventional mixer as shown in FIG. 2, the word length WL is increased until the desired accuracy is achieved.

The mixer according to the prior art, shown in FIG. 2, has the disadvantage that the necessary word length WL is relatively great. This, in turn, has the consequence that the necessary multiplier unit circuit can only be implemented with great complexity. In addition, the storage space for the mixer coefficients, which is necessary for the storage unit, is relatively great.

It is, therefore, the object of the present invention to create a method for generating multiplier coefficients for a mixer and a corresponding mixer in which the word length of the multiplier coefficients is relatively small and which, nevertheless, provide very high accuracy.

According to the invention, this object is achieved by a method having the feature specified in claim 1 and by a mixer having the features specified in claim 8 and 9, respectively.

The invention creates a method for generating multiplier coefficients for a 1:m mixer, comprising the following steps:

recursive calculating of a multiplier set, selecting a multiplier group, consisting of a number of multipliers, from the calculated multiplier set in dependence on a predetermined signal/noise ratio of the mixer, and writing multiplier coefficients into a memory of the mixer in accordance with the selected multiplier group.

The method according to the invention leads to multiplier coefficients in which, by doubling the word length WL of the multiplier coefficients, an accuracy of the mixer is achieved which is higher by 12 dB.

This results in almost perfect mixing, even if the input signals have a low amplitude and/or there are adjacent channels having high amplitudes. As a result, the necessary input word length becomes less. The result is that the area or, respectively, the current consumption of the subsequent stages can also be reduced.

In a preferred embodiment of the method according to the invention, the mixer is a 1:10 mixer, in which, during the recursive calculation, after initialization of a first multiplier $V_0$ of the multiplier set (MS) to zero ($V_0$=0) and of a second multiplier $V_1$ of the multiplier set (MS) to one ($V_1$=1), the further multipliers of the multiplier set (MS) are calculated in accordance with the following recursion rule:

$$V_{i+2}=V_i+V_{i+1} \text{ for all } i=0, 1, 2 \ldots i_{max}$$

In a preferred embodiment, a multiplier group consisting of two multipliers is selected from the multiplier, the run index i of which produces a signal/noise ratio $$(SNR) = 20 \log\left[\frac{1+\sqrt{5}}{2}\right]^2 \cdot \left(i+\frac{1}{2}\right)$$

which is higher than the predetermined signal/noise ratio ($SNR_{NOM}$) of the mixer.

During this process, the following multiplier coefficients (MC) are preferably written into the memory:

$$MC=(0, V_i, V_{i+1}, V_{i+1}, V_i, 0, -V_i, -V_{i+1}, -V_{i+1}, V-V_i)$$

In a second embodiment of the 1:10 mixer, a multiplier group consisting of three multipliers is selected from the multiplier set, the run index i of which produces a signal signal/noise ratio $$(SNR) = 20 \log\left[\frac{1+\sqrt{5}}{2}\right]^2 \cdot \left(i+\frac{1}{2}\right)$$

which is higher than the predetermined signal/noise ratio ($SNR_{NOM}$) of the mixer.

During this process, the following multiplier coefficients (MC) are preferably written into the memory of the mixer:

$$MC=(V_i, V_{i+2}, 2*V_{1+2}, V_{1+2}, V_1, -V_i, -V_{1+2}, -2*V_{1+2}, -*V_{i+2}, -V_1)$$

In an alternative embodiment, the mixer is a 1:8 mixer, in which, during the recursive calculation after initialization of a first multiplier $V_0$ of the multiplier set to zero ($V_0=0$) and of a second multiplier $V_1$ of the multiplier set (MS) to one ($V_1=1$), the further multipliers of the multiplier set (MS) are calculated in accordance with the following recursion rule:

$$V_{i+2}=V_i+V_{i+1}$$

$$V_{i+3}=V_i+V_{i+2}$$

for all even-numbered $i=0, 2, 4 \ldots i_{max}$

During this process, a multiplier group consisting of two multipliers is selected from the multiplier set, the run index i of which produces a signal/noise ratio $SNR=20\log(1+\sqrt{2})*i$, which is higher than the predetermined signal/noise ratio ($SNR_{NOM}$) of the mixer.

The following multiplier coefficients (MC) are preferably written into the memory of the mixer:

$$MC=(0, V_1, V_{i+1}, V_i, 0, -Vi, -V_{i+1}, -V_1)$$

In an alternative embodiment of the 1:8 mixer, a multiplier group (MG) consisting of two multipliers ($V_i$, $V_{i+2}$) is selected from the multiplier set (MS), the run index i of which produces a signal/noise ratio $SNR=20\log[1+\sqrt{2}](i+1)$ which is higher than the predetermined signal/noise ratio ($SNR_{NOM}$) of the mixer.

During this process, the following multiplier coefficients (MC) are preferably written into the memory of the mixer:

$$MC=(V_i, V_{i+2}, V_{i+2}, V_i, -V_i, -V_{1+2}, -V_{i+2}, -V_i)$$

In an alternative embodiment, the mixer is a 1:12 mixer, and during the recursive calculation after initialization of a first multiplier $V_0$ of the multiplier set (MS) to one ($V_0=1$) and of a second multiplier $V_1$ of the multiplier set (MS) to one ($V_1=1$), the further multipliers of the multiplier set (MS) are calculated in accordance with the following recursion rule:

$$V_{i+2}=-V_i+2*V_{i+1}$$

$$V_{i+3}=V_i+V_{i+1}$$

$$V_{i+4}=V_i+2*V_{i+1}$$

$$V_{i+5}=V_i+3*V_{i+1}$$

During this process, a multiplier group consisting of two multipliers is preferably selected from the multiplier set, the run index i of which produces a signal/noise ratio $$SNR = 20\log\left[\sqrt{2+\sqrt{3}}\right] \cdot (i+2)$$

which is higher than the predetermined signal/noise ratio ($SNR_{NOM}$) of the mixer.

The following multiplier coefficients (MC) are preferably written into the memory of the mixer:

$$MC=(0, V_i, V_{i+2}, 2*V_i, V_{i+2}, V_i, 0, -V_i, -V_{i+2}, -2*V_i, -2*V_{i+2}, -V_i)$$

In an alternative embodiment of the 1:12 mixer, a multiplier group consisting of two multipliers ($V_{i+3}$, $V_{i+2}$) is selected from the multiplier set (MS), the run index i of which produces a signal/noise ratio $$SNR = 20\log\left[\sqrt{2+\sqrt{3}}\right] \cdot (i+5)$$

which is higher than the predetermined signal/noise ratio $SNR_{NOM}$ of the mixer.

During this process, the following multiplier coefficients (MC) are preferably written into the memory of the mixer:

$$MC=(V_i, V_{i+3}, V_{i+4}, V_{i+4}, V_{i+3}, Vi, -V_1, -V_{i+3}, -V_{i+4}, -V_{i+4}, -V_{i+3}, -V_i)$$

The multipliers of the multiplier groups (MG) are preferably resolved into Horner coefficients. Resolving into Horner coefficients provides the possibility of building up the multiplier with simple shift/adder structures. This considerably reduces the circuit complexity for implementing the mixing unit. In addition, it makes it possible to achieve a further saving in storage space in the storage unit.

The invention also creates a mixer for mixing a digital input signal with a sampled sinusoidal signal, comprising
(a) a multiplier unit for multiplying the digital input signal by multiplier coefficients (MC);
(b) and a coefficient memory for storing multiplier coefficients (MC) which can be applied to the multiplier unit by means of an address generator,
(c) and comprising a connectable coefficient generator for generating the multiplier coefficients (MC) by recursive calculation of a multiplier set (MS) from which a multiplier group (MG) consisting of a number of multipliers is selected in dependence on a predetermined signal/noise ratio ($SNR_{NOM}$) of the mixer and corresponding multipliers (MC) are written into the coefficient memory.

The invention also creates a mixer for mixing a digital input signal with a sampled sinusoidal signal, comprising
(a) a calculation circuit for calculating multipliers (MC) of a multiplier group (MG), which exhibits a number of dividing circuits for dividing the digital input signal applied to an input of the mixer, and a number of switchable adders/subtractors,
  the dividing factors of the dividing circuits being Horner coefficients of the resolved multipliers (MC) of the multiplier group (MG),
  the adders/subtractors being controlled in dependence on a first control bit (SUB/ADD) read out of a memory;
(b) a demultiplexer for switching through a zero value or the multiplier (MC) calculated by the calculating circuit in dependence on a second control bit (zero) read out of the memory; and comprising
(c) a sign circuit for outputting the positive or negative value switched through by the demultiplexer to an output of the mixer in dependence on a third control bit (SIGN) read out of the memory.

The dividing circuits are preferably shift registers.

In preferred embodiments of the mixer according to the invention, an address generator for reading out the control bits is also provided.

The memory is preferably a read-only memory.

In an alternative embodiment, the memory is programmable.

In the text which follows, preferred embodiments of the method according to the invention for generating multiplier coefficients and of the mixer according to the invention for mixing a digital input signal with a sampled sinusoidal signal are described with reference to the attached figures for explaining features essential to the invention.

In the Figures:

FIG. 7 shows a table of the control signals stored in the memory of the mixer shown in FIG. 6;

FIG. 4 shows an essential step of the method according to the invention for generating multiplier coefficients for a 1:m mixer according to the invention.

After a start step $S_0$, after an initialization step for initializing multipliers, multipliers of a multiplier set MS are recursively calculated in a step $S_1$.

Subsequently, a multiplier group MG for a predetermined accuracy is calculated from the calculated multiplier set MS in a step $S_2$. The predetermined accuracy is obtained from the desired signal/noise ratio $SNR_{NOM}$ of the mixer.

In a further step $S_3$, the multiplier coefficients are written into the memory of the mixer in accordance with the selected multiplier group MG. The method ends in step $S_4$.

Figure 1:
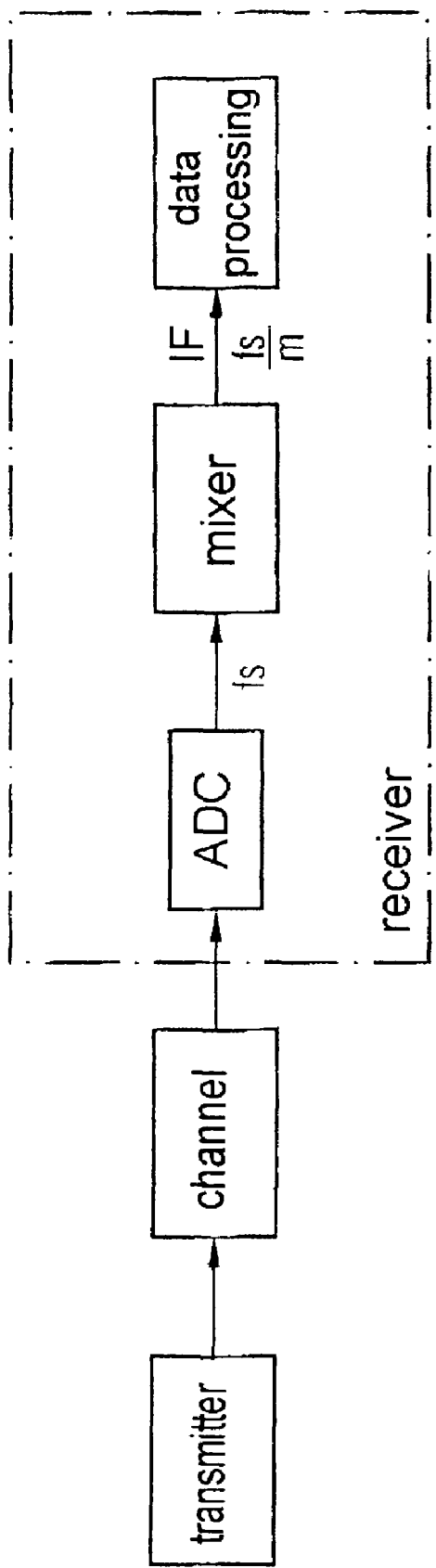
FIG. 1 shows a receiver according to the prior art.
Figure 2:
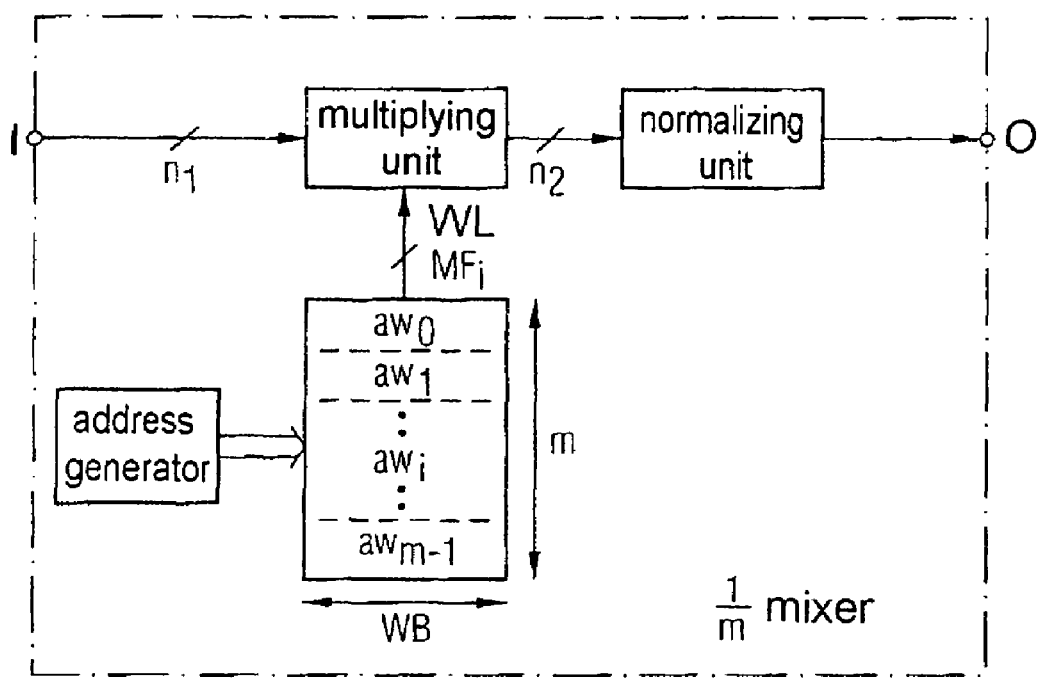
FIG. 2 shows a 1:m mixer according to the prior art.
Figure 3:
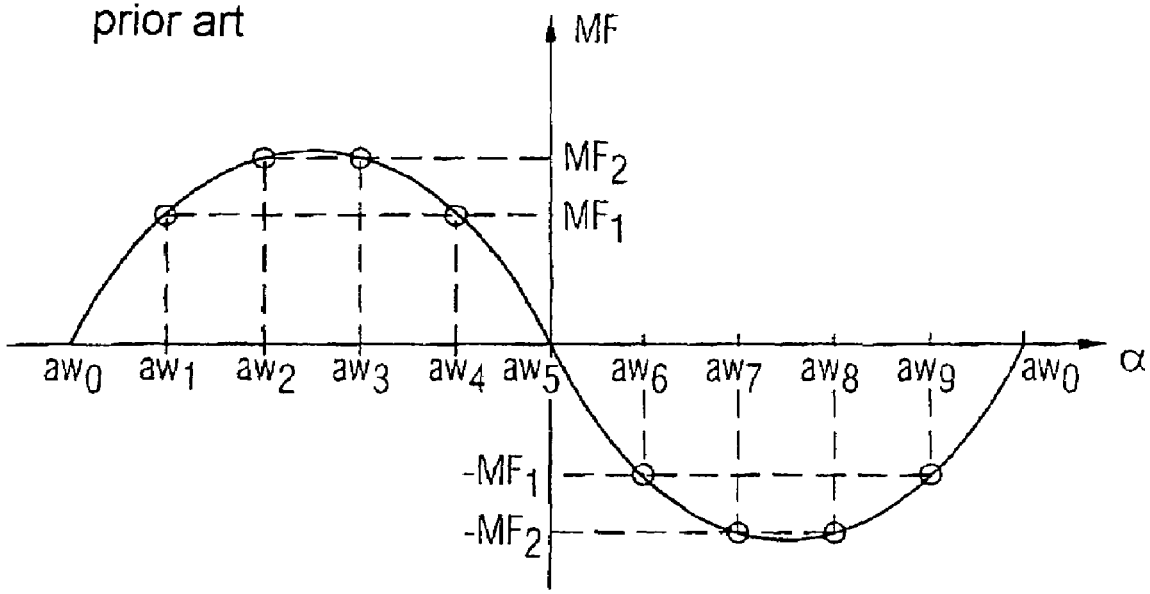
FIG. 3 shows a sampled sinusoidal signal according to the prior art.
Figure 4:
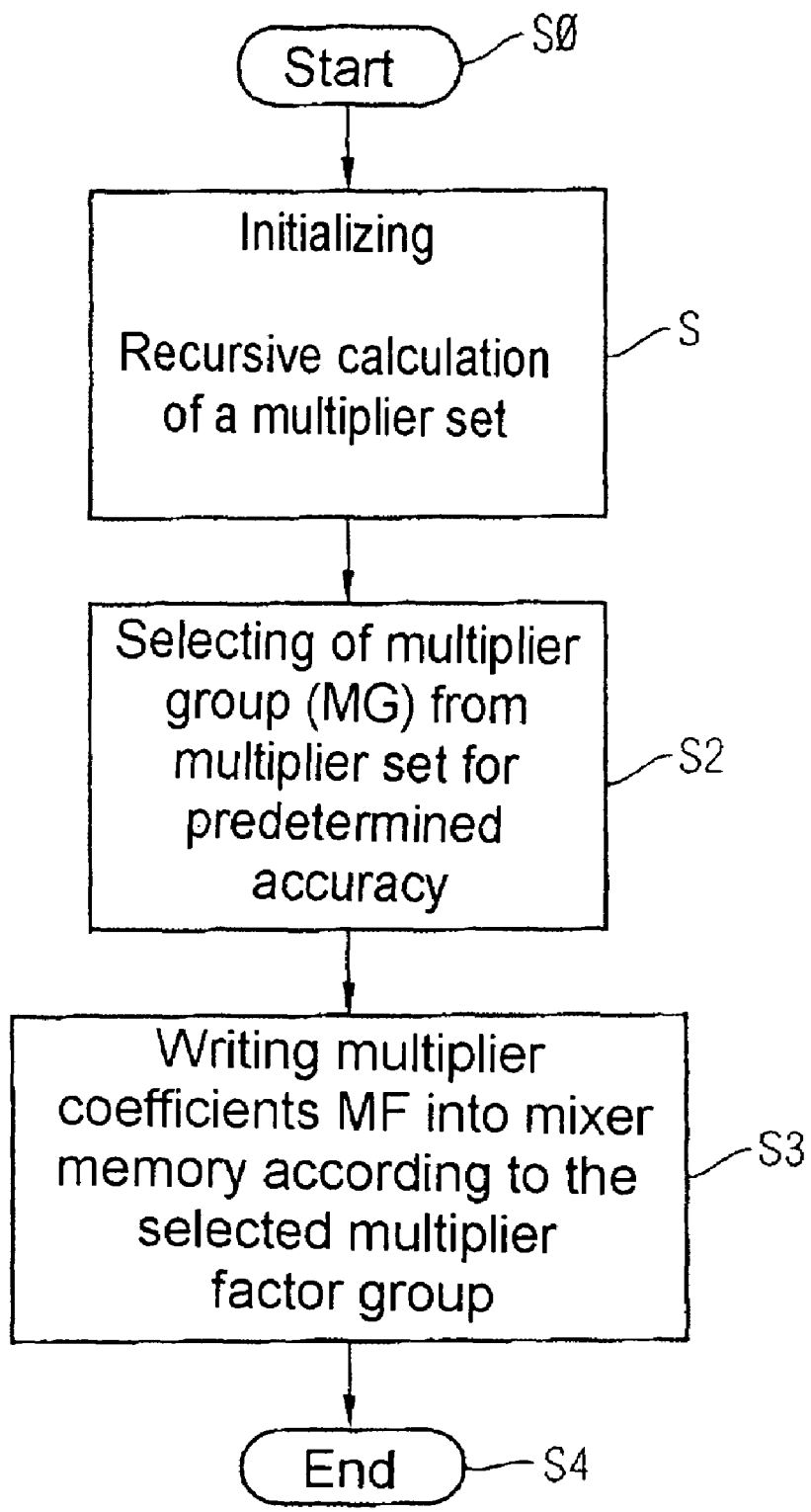
FIG. 4 shows a flow chart for explaining the method according to the invention.

The method illustrated in FIG. 4 will be explained by means of an example in the text which follows. By way of example, multiplier coefficients for a 1:10 mixer are calculated in accordance with the method according to the invention.

In step $S_1$, two multipliers $V_0$ and $V_1$ are first initialized in the method according to the invention. During this process, multiplier $V_0$ is initialized to 0 and the second multiplier $V_1$ is initialized to 1. $V_0=0; V_1=1$.

After that, further multipliers of the multiplier set (MS) are recursively calculated in accordance with the following recursion rule:

$$V_{i+2}=V_i+V_{i+1} \text{ for all } i=0, 1, 2 \ldots i_{max}$$

This recursion is a recursion rule for calculating Fibonacci numbers. The resultant multipliers of the multiplier set are:

0, 1, 1, 2, 3, 5, 8, 13, 21, 34, 55, 89, 144, 233, 377, 610, 987, 1597 . . .

From the calculated multiplier set MS specified above, a multiplier group MG consisting of two multipliers $V_i, V_{i+1}$ are selected in accordance with a desired signal/noise ratio SNR of the mixer, the run index i of which produces a signal/noise ratio $$(SNR) = 20 \, \log\left[\frac{1+\sqrt{5}}{2}\right]^2 \cdot \left(i+\frac{1}{2}\right) = 8.36\left(i+\frac{1}{2}\right)$$

which is higher than the predetermined signal/noise ratio $SNR_{NOM}$ of the mixer.

After that, the calculated in-phase multiplier coefficients MC are written into the memory of the mixer:

$$MC=(0, V_i, V_{i+1}, V_{i+1}, V_i, 0, -V_i, -V_{i+1}, -V_{i+1}, -V_i)$$

In an alternative embodiment of the 1:10 mixer, the multiplier coefficients offset by Π10 are calculated instead of the in-phase multiplier coefficients.

For this purpose, three multipliers $V_i$, $V_{i+1}$, $V_{i+2}$ are selected from the multiplier set MS calculated in step $S_1$, the run index i of which produces a signal/noise ratio $$(SNR) = 20 \, \log\left[\frac{1+\sqrt{5}}{2}\right]^2 \cdot (i+1)$$

which is higher than the predetermined signal/noise ratio $(SNR_{NOM})$ of the mixer.

After that, the following multiplier coefficients MC are written into the memory of the mixer in step $S_3$:

$$MC=(V_i, V_{i+2}, 2*V_{i+2}, V_{i+2}, V_i, -V_i, -V_{i+2}, -2*V_{i+2}, -V_{i+2}, -V_i)$$

The method according to the invention can also be used for calculating multiplier coefficients for a 1:8 mixer.

In this process, a first multiplier $V_0$ is first initialized to 0 and a second multiplier $V_1$ of the multiplier set is initialized to 1.

After that, the further multipliers $V_i$ of the multiplier set MS are calculated in accordance with the following recursion rule:

$$V_{i+2}=V_i+V_{i+1}$$

$$V_{i+3}=V_i+V_{i+2}$$

Using this recursion rule, the following multipliers of the multiplier set MS are calculated:

0, 1, 1, 1, 2, 3, 5, 7, 12, 17, 29, 41, 70, 99, 169, 239, 408, 577, 985, 1393, . . .

From the calculated multiplier coefficients MC of the multiplier set (MS), a multiplier group MG consisting of two multipliers $V_i$, $V_{i+1}$ is selected, the run index i of which produces a signal/noise ratio $SNR=20 \, \log(1+\sqrt{2})*i$ which is higher than the predetermined signal/noise ratio $(SNR_{NOM})$ of the mixer.

In step $S_3$, the following eight multiplier coefficients (MC) are then written into the memory of the mixer:

$$MC=(0, V_i, V_{i+1}, V_i, 0, -V_i, -V_{i+1}, -V_i)$$

In an alternative embodiment for calculating the multiplier coefficients in a 1:8 mixer, two multipliers of $V_i, V_{i+1}$, which form a multiplier group MG, are selected from the multiplier set MS, the run index i of which produces a signal/noise ratio $SNR=20 \, \log(1+\sqrt{2})(i+1)$ which is higher than the predetermined signal/noise ratio $(SNR_{NOM})$ of the mixer.

In step $S_3$, the following multiplier coefficients MC are then written into the memory of the mixer:

$$MC=(V_i, V_{i+2}, V_{i+2}, V_i, -V_i, -V_{i+2}, -V_{i+2}, -V_i)$$

In a further embodiment of the calculating method according to the invention for calculating multiplier coefficients, multiplier coefficients for a 1:12 mixer are calculated.

During this process, a first multiplier $V_0$ is first initialized to 1 and a second multiplier $V_1$ is also initialized to 1.

$$V_0=1$$

$$V_1=1$$

After that, the further multipliers of the multiplier set MS are calculated in accordance with the following recursion rule:

$$V_{i+2}=-V_i+2*V_{i+1}$$

$$V_{i+3}=V_i+V_{i+1}$$

$$V_{i+4} = V_i + 2 * V_{i+1}$$

$$V_{i+5} = V_i + 3 * V_{i+1}$$

The multiplier coefficients calculated in accordance with this recursion rule are obtained as:

1, 1, 2, 3, 4, 5, 7, 11, 15, 19, 26, 41, 56, 71, 97, 153, 209, 265, 362, 571, 780, 989, 1351, ...

In a step $S_2$ of the method according to the invention, a multiplier group MG consisting of two multipliers $V_i$, $V_{i+2}$ is selected from the multiplier set, the run index i of which produces a signal/noise ratio $$SNR = 20\log\left[\sqrt{2+\sqrt{3}}\right] \cdot (i+2)$$

which is higher than the predetermined signal/noise ratio ($SNR_{NOM}$) of the mixer, where i=0, 4, 8, ...

After that, the following twelve multiplier coefficients MC are written into the memory of the mixer in a step $S_3$:

$MC = (0, V_i, V_{i+2}, 2*V_i, V_{i+2}, V_i, 0, -V_i, -V_{i+2}, 2*V_i, -2*V_{i+2}, -V_i)$ for $i=0, 1, 4, 5, 8, 9 ...$ In an alternative embodiment for calculating the multiplier coefficients of the 1:12 mixer, a selection is made from the multiplier set MS for another multiplier group MG consisting of two multipliers $V_{i+3}$, $V_{i+4}$, the run index i of which produces a signal/noise ratio $$SNR = 20\log\left[\sqrt{2+\sqrt{3}}\right] \cdot (i+5)$$

which is higher than the predetermined signal/noise ratio $SNR_{NOM}$ of the mixer, where i=1, 5, 9 ...

Figure 5:
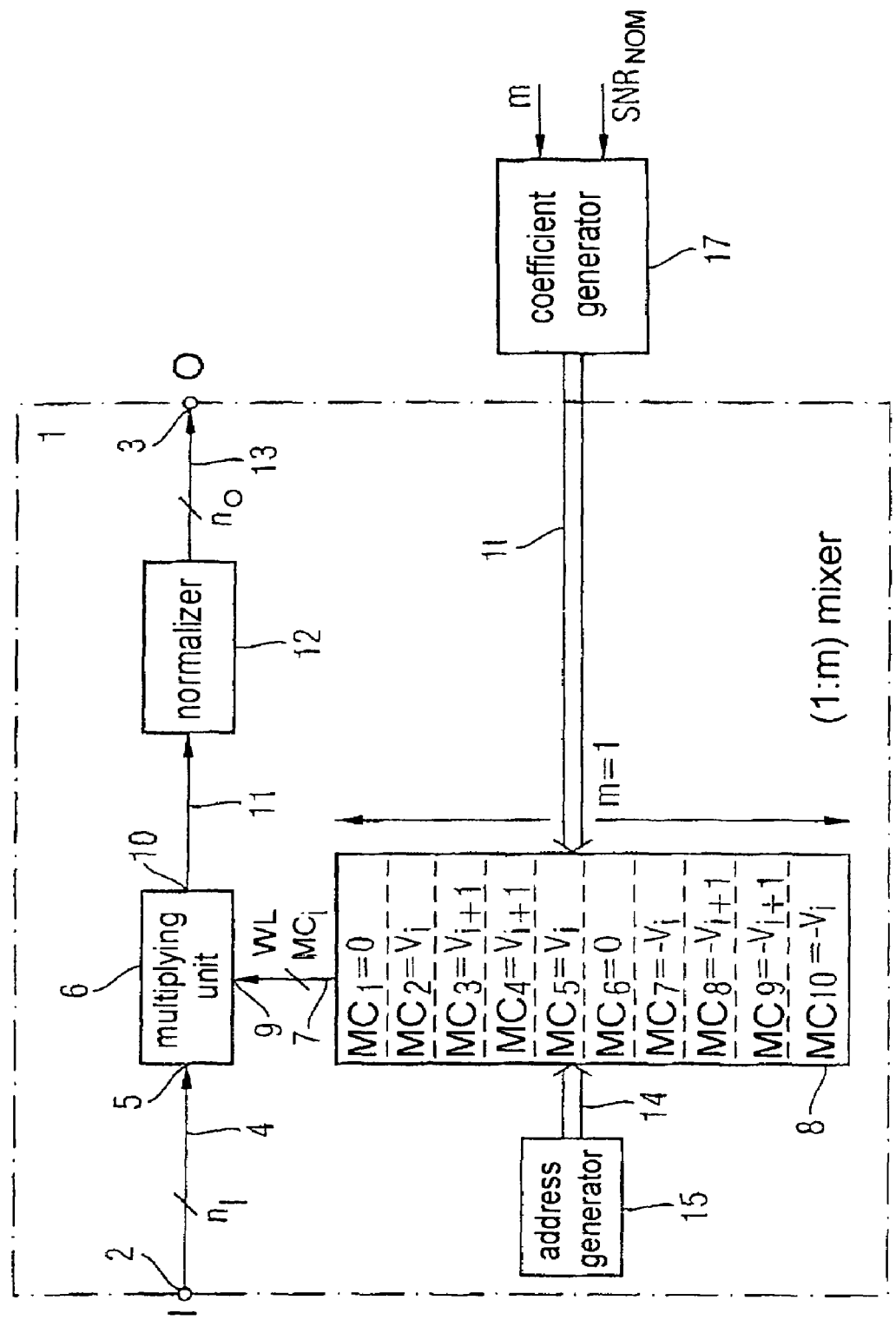
FIG. 5 shows a block diagram of a first embodiment of the mixer according to the invention.

The following multiplier coefficients MC are then written into the memory of the mixer in a step $S_3$:

$MC = (V_i, V_{i+3}, V_{i+4}, V_{i+4}, V_{i+3}, V_i, -V_i, -V_{i+3}, -V_{i+4}, -V_{i+4}, -V_{i+3}, -V_i)$ for $i=1, 3, 5 ...$ In the examples represented above, multiplier coefficients were calculated for a 1:10, a 1:8 and a 1:12 mixer. With the calculated multiplier coefficients, 1:m mixers according to the invention as shown in FIG. 5 can be implemented. The example shown in FIG. 5 is a 1:10 mixer. The mixer 1 according to the invention has a signal input 2 and a signal output 3. The digital input signal converted by the analog/digital converter passes from the input 2 of the mixer 1 via lines 4 to a first input 5 of a multiplier unit 6. The multiplier unit 6 multiplies the digital input signal by stored samples which are supplied to the multiplier unit 6 via lines 7 from a memory 8. The number of lines between a memory 8 and a multiplier unit 6 corresponds to the word length of the memory WL. The multiplier coefficients $MM_i$ read out of the memory 8 are applied to a second input 9 of the multiplier unit 6 via lines 7. The multiplier unit 6 multiplies the digital input value present at input 5 via the sinusoidal output value or multiplier $MC_i$ to form a digital value which is output to a subsequent normalizer 12 via an output 10 of the multiplier unit 6 and lines 11. The normalizer 12 is connected to the output 3 of the mixer 1 according to the invention via lines 13.

The memory 8 is enabled by an address generator 15 of the mixer 1 via address lines 14. The address generator 15 cyclically activates the multiplier coefficients $MC_i$, stored in the memory 8 of the memory unit, for multiplication within the multiplier unit 6.

The stored multiplier coefficients MCI can be represented as:

$MCI = W_i \times 2^k$, where $W_i \leq 1$.

The normalizing unit 12 following the multiplier unit 6 is provided for normalizing the output value of the multiplier unit 6, the normalizer 12 essentially consisting of a shift register which shifts the output value of the multiplier unit 6 to the right by a certain number of positions.

The memory 8 of the mixer 1 is preferably a read-only memory in which the calculated multiplier coefficients MCI are permanently stored.

In an alternative embodiment, the memory unit 8 is a programmable memory which can be connected to a multiplier coefficient generator 17 via programming lines 16. In the coefficient generator 17, the multiplier coefficients are calculated in accordance with the method according to the invention and are written into the memory 8. For this purpose, the coefficient generator 17 can be preferably supplied with the mixing ratio m and the desired signal/noise ratio $SNR_{NOM}$ for the calculation. The coefficient generator 17 calculates, in dependence on the mixing ratio m=8, 10, 12 applied and the desired signal/noise ratio $SNR_{NOM}$ the necessary multiplier coefficients $MM_i$ which are stored in a memory 8.

Using the method according to the invention, multiplier coefficients can be calculated in a simple manner for a 1:8, a 1:10 and a 1:12 mixer. During this process, multiplier coefficients $MM_i$ can be calculated in each case for an in-phase set of coefficients and an out-of-phase set of coefficients. The phase shift between a mixer with in-phase set of coefficients and a mixer with out-of-phase set of coefficients is Π/8, in the case of 1:8 mixer, Π/10 in the case of a 1:10 mixer and Π/12 in the case of a 1:12 mixer.

According to the invention, mixers having twice the period length, i.e. a 1:16 mixer, a 1:20 mixer and a 1:24 mixer can be implemented in a simple manner by storing both the in-phase set of coefficients and the out-of-phase set of coefficients in the memory 8.

In a preferred embodiment of the mixer according to the invention, gain control is also performed following the multiplier unit 6.

In the 1:m mixer according to the invention according to the first embodiment as shown in FIG. 5, the calculated multiplier coefficients MC are distinguished by the fact that they map the sampled sine wave with the greatest possible accuracy with a predetermined word length WL.

Figure 6:
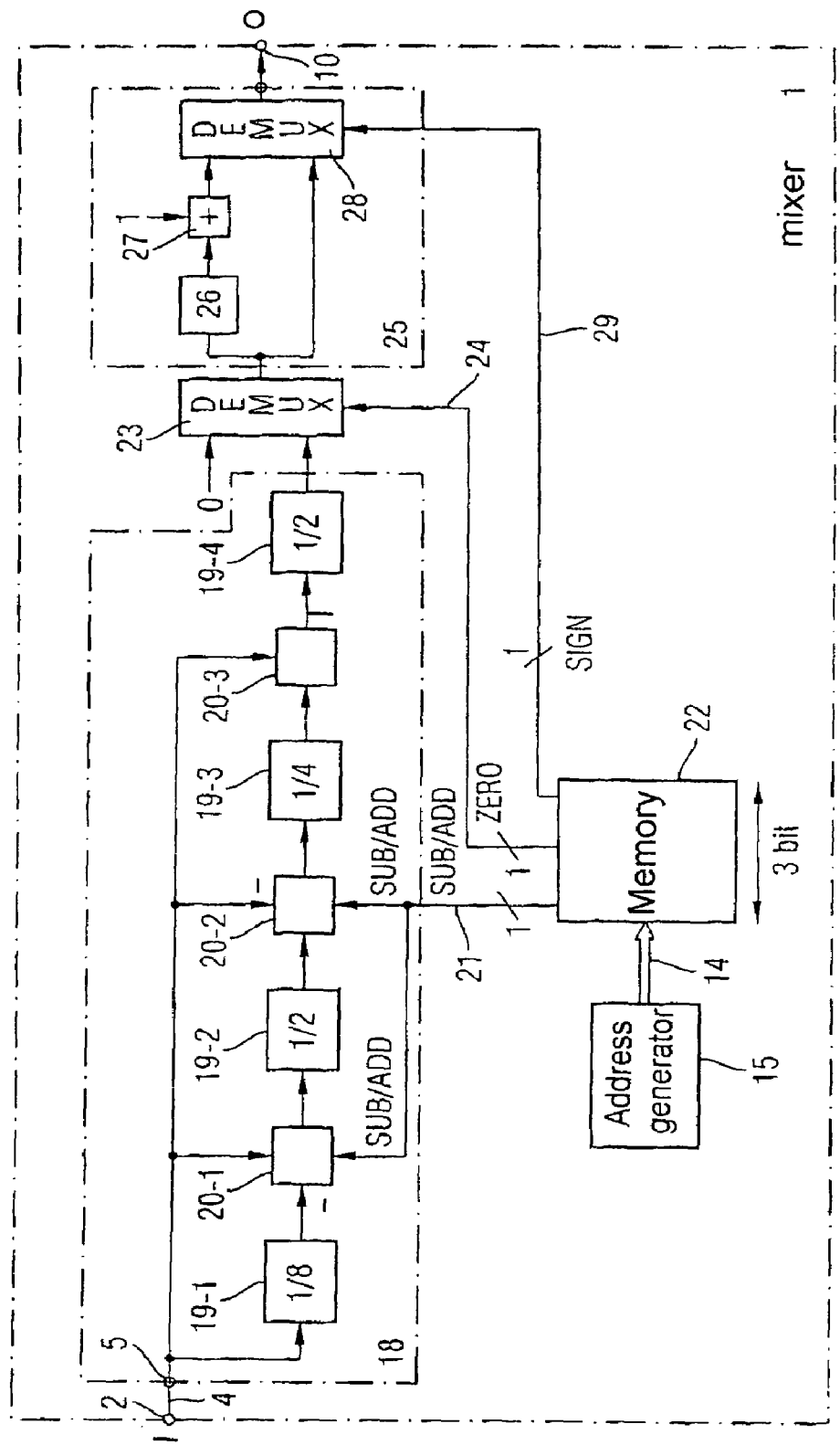
FIG. 6 shows a block diagram of a second preferred embodiment of the mixer according to the invention.

FIG. 6 shows a particularly preferred embodiment of the mixer 1 according to the invention.

In this particularly preferred embodiment, the multiplier unit 6 shown in FIG. 5 is replaced by a shift register/adder structure so that the circuit complexity of the mixer 1 according to the invention is greatly reduced.

For this purpose, the multipliers of the multiplier group MG, calculated in accordance with the invention, are split into Horner coefficients.

The Horner dissection is explained by way of example in the text which follows.

The embodiment shown in FIG. 6 is a 1:10 mixer. In the method according to the invention, the multiplier set MS consisting of many multipliers is first calculated in step $S_1$.

After that, two multipliers are selected as multiplier group MG from the calculated multiplier set MS in dependence on a positive signal/noise ratio $SNR_{NOM}$ in step $S_2$. In the examples shown, for example, multipliers $V_i=55$ and $V_i1=89$ are selected from the multiplier set MS, which supply the desired signal/noise ratio $SNR_{NOM}$.

The next higher power of 2 of the larger multiplier 89 is 128.

The two multipliers 55, 89 are resolved in accordance with the Horner scheme, as follows:

$$55:128 = -\tfrac{1}{128} + \tfrac{1}{16} - \tfrac{1}{8} + \tfrac{1}{2} = (((-\tfrac{1}{8}+1):2-1):4+1):2$$

$$89:128 = +\tfrac{1}{128} + \tfrac{1}{16} + \tfrac{1}{8} + \tfrac{1}{2} = (((+\tfrac{1}{8}+1):2+1):4+1):2$$

FIG. 6 shows the circuit implementation of the mixer 1 according to the invention for a 1:10 mixer for the multiplier coefficients 55, 89.

The mixer 1 according to the invention contains a calculating circuit 18 for calculating the multiplier coefficients MC1=55 and MC2=89 of the multiplier group 55, 89. The calculating circuit 18 consists of a number of dividing circuits 19-1, 19-2, 19-3, 19-4 and interposed adders/subtractors 20-1, 20-2, 20-3.

The dividing circuits 19-i are preferably shift registers which shift the applied digital value to the right by a few bits. In the case of a division by the factor 8, for example, the digital value applied is shifted to the right by 3 bits ($2^3=8$). The switchable adders/subtractors 20-i add or subtract the applied values in dependence on a sub/add control signal which is applied to the calculating circuit 18 via a control line 21. The associated control bit is stored in a memory 22. In the memory 22 of the second embodiment of the mixer 1 according to the invention, shown in FIG. 6, in contrast to the memory 8 of the first embodiment shown in FIG. 5, it is not the multiplier coefficient $MC_i$ itself which is stored but control bits for generating the multiplier coefficients.

In the example shown in FIG. 6, the adder/subtractor unit 20-1 and the adder/subtractor unit 20/2 are supplied with the first control bit sub/add, an addition being performed when the control bit is a logical 0 and a subtraction being performed when the control bit is 1.

The calculating circuit 8 is followed by a demultiplexer 23 which receives a zero control bit from the memory 22 via a further control line 24.

Depending on the received zero control bit, the demultiplexer 23 switches through either the multiplier MC calculated by the calculating circuit 18 or an applied 0. If the zero control bit is zero, the demultiplexer 23 switches through the zero value to a subsequent sign circuit 25. If the zero control bit is logically low, the multiplier value MC calculated by the calculating circuit 18 is conversely switched through to the sign circuit 25 by the demultiplexer 23. The sign circuit 25 consists of an inverting element 26, an adder 27 and a demultiplexer 28 which is activated by a further control bit (SIGN) via a control line 29. The inverting circuit 26 inverts the value output by the demultiplexer 23 which is then added together with a value 1. If the control bit SIGN is a logical 1, the demultiplexer 28 switches the inverted value through to the output of the mixer 1. In the converse case, the non-inverted multiplier coefficient $MC_i$ output by the demultiplexer 28 is output.

FIG. 7 shows the memory content of the memory 22 shown in FIG. 6. In the memory 22, three control bits are in each case stored for each multiplier coefficient $MC_i$ to be calculated of the multiplier coefficient sets MS consisting of ten coefficients so that the memory size is 10×3 bits in the example shown. The memory size of the memory 22 is thus considerably less in comparison with the memory size of the mixer according to the first embodiment shown in FIG. 5 and conventional mixers.

The address generator 15 cyclically generates the memory addresses of the ten registers of the memory 22, in which three control bits are located in each case. The sub/add, zero, SIGN control bits read out activate the calculating circuit 8, the demultiplexer 23 and the sign circuit 25 via control lines 21, 24, 29. At the output, these generate the two multiplier coefficients 55, 89 and −55, −89, respectively, of the multiplier group.

Figure 8:
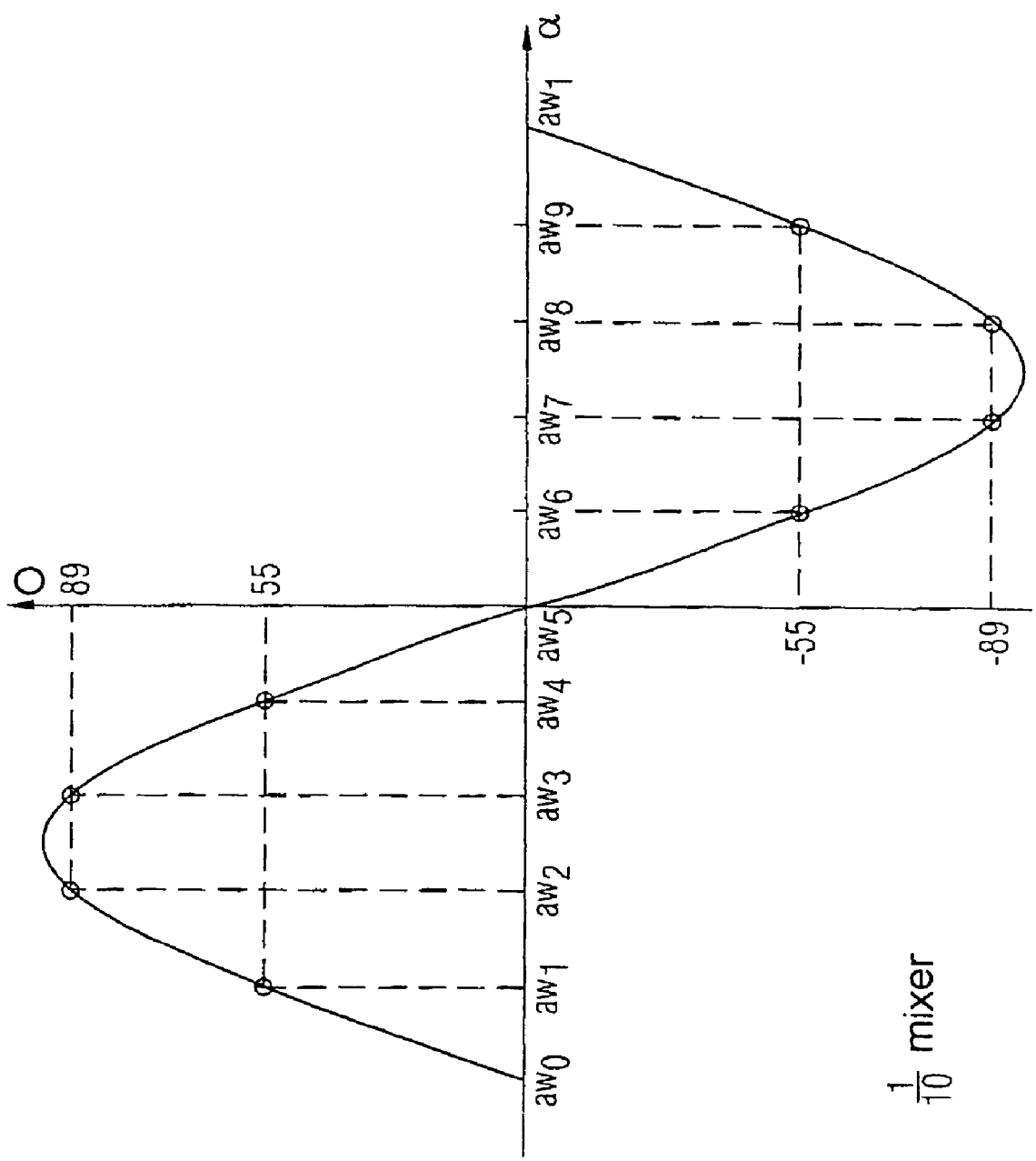
FIG. 8 shows a diagram of the calculated multiplier coefficients in a 1:10 mixer according to the invention.

FIG. 8 shows the output of the 1:10 mixer according to the invention, shown in FIG. 6, for the two multiplier coefficients 55, 89. As can be seen in FIG. 8, the multiplier coefficients 55, 89 very accurately duplicate a sampled sine wave.

The 1:10 mixer shown in FIG. 6 exhibits minimum circuit complexity for the calculating circuit 18. In addition, the memory size of the memory 22 can be minimized since only control bits are stored and not the multiplier coefficients MCI themselves.

In the embodiment shown in FIG. 6, the memory 22 is a ROM memory. In an alternative embodiment, the memory 22 can be programmed via programming lines.

The invention claimed is:

1. A method for generating multiplier coefficients for a (1:m) mixer, comprising the steps of:
    (a) performing recursive calculation of a multiplier set (MS);
    (b) selecting a multiplier group (MG) consisting of a number of multipliers from the calculated multiplier set (MS) in dependence on a predetermined signal/noise ratio ($SNR_{NOM}$) of the mixer, wherein selecting a multiplier group (MG) comprises (i) selecting a multiplier group (MG) from the multiplier set (MS) consisting of two multipliers ($V_i$, $V_i+1$), the run index i of which produces a signal/noise ratio (SNR)=20 log $[(1+\sqrt{5})/2]^2 \cdot (i+1/2)$ that is higher than the predetermined signal/noise ratio ($SNR_{NOM}$) of the mixer, or (ii) selecting a multiplier group (MG) from the multiplier set (MS) consisting of three multipliers (Vi, Vi+1, Vi+2), the run index i of which produces a signal/noise ratio (SNR)=20 log $[(1+\sqrt{5})/2]2 \cdot (i+1)$ that is higher than the predetermined signal/noise ratio $SNR_{NOM}$) of the mixer;
    (c) writing the multiplier coefficients (MC) into a memory of the mixer in accordance with the selected multiplier group (MG); and
    (d) during the step of recursive calculation, after initialization of a first multiplier $V_0$ of the multiplier set (MS) to zero ($V_0=0$) and initialization of a second multiplier $V_1$ of the multiplier set (MS) to one ($V_1=1$), further multipliers of the multiplier set (MS) are calculated in accordance with the following recursion rule:

$$V_{i+2} = V_i + V_{i+1} \text{ for all } i=0, 1, 2 \ldots i_{max},$$

wherein the mixer comprises a 1:10 mixer.

2. The method as recited in claim 1, wherein the step of writing the multiplier coefficients into a memory of the mixer comprises:
    writing the following multiplier coefficients (MC) into the memory of the mixer:

$$MC=(0, V_i, V_{i+1}, V_{i+1}, V_i, 0, -V_i, -V_{i+1}, -V_{i+1}-V_i).$$

3. The method as recited in claim 1, wherein the step of writing multiplier coefficients into a memory of the mixer comprises:
    writing the following multiplier coefficients (MC) into the memory of the mixer:

$$MC=(V_i, V_{i+2}, 2*V_{i+2}, V_{i+2}, V_i, -V_i, -V_{i+2}, -2*V_{i+2}, -V_{i+2}-V_i).$$

4. The method as recited in claim 1, wherein the step of writing multiplier coefficients into a memory of the mixer comprises:

writing the following multiplier coefficients (MC) into the memory of the mixer:

$$MC=(0, V_i, V_{i+1}, V_i, 0, -V_i, -V_{i+1}, -V_i).$$

5. The method as recited in claim 1, further comprising the step of:

resolving the multipliers of the multiplier groups (MG) into Horner coefficients.

6. A method for generating multiplier coefficients for a (1:m) mixer, comprising the steps of:

(a) performing recursive calculation of a multiplier set (MS);

(b) selecting a multiplier group (MG) consisting of a number of multipliers from the calculated multiplier set (MS) in dependence on a predetermined signal/noise ratio ($SNR_{NOM}$) of the mixer, wherein selecting the multiplier group comprises selecting the multiplier group (MG) from the multiplier set (MS) consisting of two multipliers ($V_i, V_{i+1}$) the run index i of which produces a signal/noise ratio (i) $SNR=20 \log(1+\sqrt{2})*i$ that is higher than the predetermined signal/noise ratio ($SNR_{NOM}$) or (ii) $SNR=20 \log [1+\sqrt{2}](i+1)$ that is higher than the predetermined signal/noise ratio ($SNR_{NOM}$) of the mixer;

(c) writing the multiplier coefficients (MC) into a memory of the mixer in accordance with the selected multiplier group (MG); and (d) wherein the mixer comprises a 1:8 mixer, and during the step of recursive calculation, after initialization of a first multiplier $V_0$ of the multiplier set to zero ($V_0=0$) and initialization of a second multiplier $V_1$ of the multiplier set (MS) to one ($V_1=1$), further multipliers of the multiplier set (MS) are calculated in accordance with the following recursion rule:

$$V_{i+2}=V_i+V_{i+1}$$

$$V_{i+3}=V_i+V_{i+2}$$

for all even-numbered i=0, 2, 4 ... $i_{max}$.

7. The method as recited in claim 6, wherein the step of writing multiplier coefficients into a memory of the mixer comprises:

writing the following multiplier coefficients (MC) into the memory of the mixer:

$$MC=(V_i, V_{i+2}, V_{i+2}, V_i, -V_i, -V_{i+2}, -V_i).$$

8. A method for generating multiplier coefficients for a (1:m) mixer, comprising the steps of:

(a) performing recursive calculation of a multiplier set (MS);

(b) selecting a multiplier group (MG) consisting of a number of multipliers from the calculated multiplier set (MS) in dependence on a predetermined signal/noise ratio ($SNR_{NOM}$) of the mixer, wherein selecting a multiplier group (MG) comprises (i) selecting a multiplier group (MG) from the multiplier set (MS) consisting of two multipliers ($V_i, V_{i+2}$), the run index i of which produces a signal/noise ratio $$SNR = 20\log\left[\sqrt{2+\sqrt{3}}\right]\cdot(i+2)$$

that is higher than the predetermined signal/noise ratio ($SNR_{NOM}$) of the mixer, or (ii) selecting a multiplier group (MG) from the multiplier set (MS) consisting of two multipliers ($V_{i+3}, V_{i+4}$) the run index i of which produces a signal/noise ratio $$SNR = 20\log\left[\sqrt{2+\sqrt{3}}\right]\cdot(i+5)$$

that is higher than the predetermined signal/noise ratio $SNR_{NOM}$ of the mixer;

(c) writing the multiplier coefficients (MC) into a memory of the mixer in accordance with the selected multiplier group (MG); and (d) wherein the mixer comprises a 1:12 mixer, and during the step of recursive calculation, after initialization of a first multiplier $V_0$ of the multiplier set (MS) to one ($V_0=1$) and initialization of a second multiplier $V_1$ of the multiplier set (MS) to one ($V_1=1$), further multipliers of the multiplier set (MS) are calculated in accordance with the following recursion rule:

$$V_{i+2}=V_i+2*V_{i+1}$$

$$V_{i+3}=V_i+V_{i+1}$$

$$V_{i+4}=V_i+2*V_{i+2}$$

$$V_{i+5}=V_i+3*V_{i+1}$$

for all i=0, 4, 8 ... $i_{max}$.

9. The method as recited in claim 8, wherein the step of writing multiplier coefficients into a memory of the mixer comprises:

writing the following multiplier coefficients (MC) into the memory of the mixer:

$$MC=(0, V_i, V_{i+2}, 2*V_i, V_{i+2}, V_i, 0, -V_i, -V_{i+2}, -2*V_i, -2*V_{i+2}, -V_i).$$

10. The method as recited in claim 8, wherein the step of writing multiplier coefficients into a memory of the mixer comprises:

writing the following multiplier coefficients (MC) into the memory of the mixer:

$$MC=(V_i, V_{i+3}, V_{i+4}, V_{i+4}, V_{i+3}, V_i, -V_i, -V_{i+3}, -V_{i+4}, -V_{i+4}, -V_{i+3}, -V_i).$$

11. A mixer for mixing a digital input signal with a sampled sinusoidal signal, comprising:

(a) a multiplier unit for multiplying the digital input signal by multiplier coefficients (MC);

(b) a coefficient memory for storing multiplier coefficients (MC) are applied to the multiplier unit by means of an address generator, (c) a connectable coefficient generator for generating the multiplier coefficients (MC) by recursive calculation of a multiplier set (MS) from which a multiplier group (MG) consisting of a number of multipliers is selected in dependence on a predetermined signal/noise ratio $SNR_{NOM}$ of the mixer and corresponding multipliers (MC) are written into the coefficient memory, wherein the multiplier group (MG) comprises a multiplier group (MG) from the multiplier set (MS) consisting of three multipliers (Vi, Vi+1, Vi+2), the run index i of which produces a signal/noise ratio (SNR)=20 log [(1+√5)/2] 2·(i+1) that is higher than the predetermined signal/noise ratio ($SNR_{NOM}$) of the mixer; and (d) wherein the mixer comprises a 1:10 mixer, and wherein the mixer is operable during a step of recursive calculation, after initialization of a first multiplier $V_0$ of the multiplier set (MS) to zero ($V_0$=0) and initialization of a second multiplier $V_1$ of the multiplier set (MS) to one ($V_1$=1), to calculate further multipliers of the multiplier set (MS) in accordance with the following recursion rule:

$$V_{i+2}=V_i+V_{i+1} \text{ for all } i=0, 1, 2 \ldots i_{max}.$$

12. A mixer for mixing a digital input signal with a sampled sinusoidal signal, comprising:

(a) a calculating circuit for calculating multipliers (MC) of a multiplier group (MG), the calculating circuit having a number of dividing circuits for dividing the digital input signal applied to an input of the mixer, and a number of switchable adders/subtractors, wherein dividing factors of the dividing circuits are Horner coefficients of the calculated multipliers (MC) of the multiplier group (MG), and adders/subtractors are controlled in dependence on a first control bit (SUB/ADD) read out of a memory of the mixer;

(b) a demultiplexer for switching through a zero value or the multipliers (MC) calculated by the calculating circuit in dependence on a second control bit (zero) read out of the memory; and (c) a sign circuit for outputting the positive or negative value switched through by the demultiplexer to an output of the mixer in dependence on a third control bit (SIGN) read out of the memory.

13. The mixer as recited in claim 12, wherein the dividing circuits comprise shift registers.

14. The mixer as recited in claim 12, further comprising:
an address generator for reading out the control bits from the memory.

15. The mixer as recited in claim 14, wherein the memory comprises a read-only memory (ROM).

16. The mixer as recited in claim 14, wherein the memory is programmable.

* * * * *